United States Patent [19]

Kundu et al.

[11] Patent Number: 5,629,858
[45] Date of Patent: May 13, 1997

[54] CMOS TRANSISTOR NETWORK TO GATE LEVEL MODEL EXTRACTOR FOR SIMULATION, VERIFICATION AND TEST GENERATION

[75] Inventors: Sandip Kundu, Austin, Tex.; Andreas Kuehlmann, Poughkeepsie, N.Y.; Arvind Srinivasan, Sunnyvale, Calif.

[73] Assignee: International Business Machines Corporation, Armonk, N.Y.

[21] Appl. No.: 406,283

[22] Filed: Mar. 17, 1995

Related U.S. Application Data

[63] Continuation of Ser. No. 332,180, Oct. 31, 1994, abandoned.
[51] Int. Cl.[6] ................................................. G06F 17/50
[52] U.S. Cl. .................................................... 364/488
[58] Field of Search ...................... 364/488, 489, 364/490, 578; 371/23, 22.6, 26, 27

[56] References Cited

U.S. PATENT DOCUMENTS

| | | | |
|---|---|---|---|
| 4,725,971 | 2/1988 | Doshi et al. | 364/578 |
| 4,970,664 | 11/1990 | Kaiser et al. | 364/488 |
| 5,084,824 | 1/1992 | Lam et al. | 364/490 |
| 5,384,710 | 1/1995 | Lam et al. | 364/489 |
| 5,416,717 | 5/1995 | Miyama et al. | 364/488 |
| 5,446,676 | 8/1995 | Huang et al. | 364/578 |
| 5,463,563 | 10/1995 | Bair et al. | 364/490 |
| 5,490,095 | 2/1996 | Shimada et al. | 364/578 |

OTHER PUBLICATIONS

A. Jain et al, "Mapping switch-level simulation onto gate-level hardware accelerators", Proc. of 28th ACM/IEEE Design Automation Conference, pp. 219-222, Jun. 1991.

R.E. Bryant, "Graph-based algorithms for boolean function manipulation", IEEE Trans. on Comp., vol. C-35, pp. 677-691, 1986.

A. Kuehlmann et al, "Error diagnosis for transistor level verification", Proc. of 31st ACM/IEEE Design Automation Conf. pp. 218-224 Jun. 1994.

*Primary Examiner*—Vincent N. Trans
*Attorney, Agent, or Firm*—Robert P. Tassinari, Jr.

[57] ABSTRACT

A technique for extracting a gate level logic model from transistor networks has been described. The resultant logic model can be technology dependent or technology independent, depending on control parameters and environment of the program. It handles all CMOS logic families including static, precharge, pass CMOS switching network and self-resetting families. The output gate level model can be used in variety of applications including but not limited to logic simulation, verification, test generation, debug, diagnosis, etc.

2 Claims, 1 Drawing Sheet

Goal is that subset of the vectors produced by running ATPG on the generated model should produce identical fault coverage as exhaustive patterns. This goal is closely satisfied by this tool.

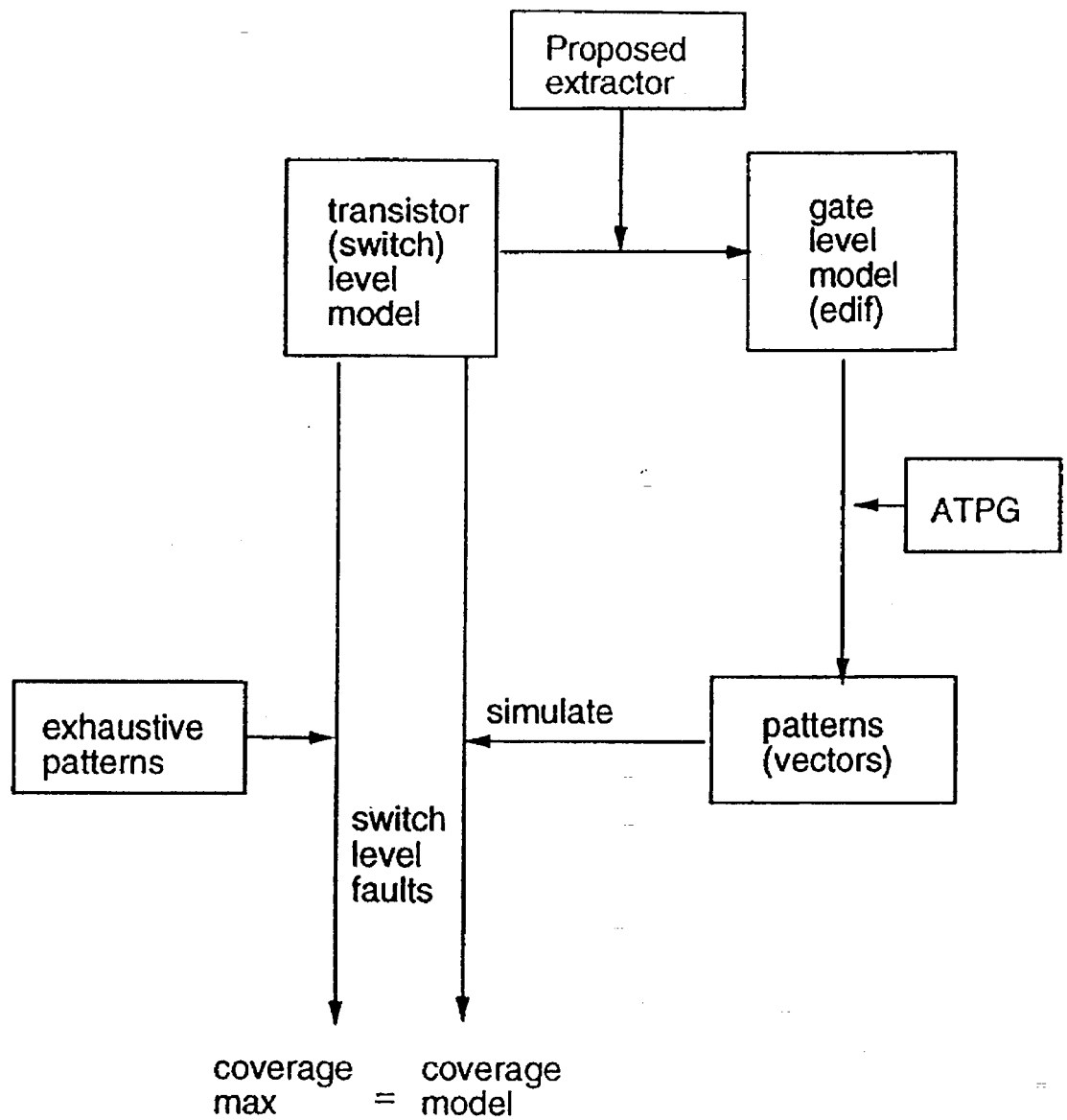
Goal is that subset of the vectors produced by running ATPG on the generated model should produce identical fault coverage as exhaustive patterns. This goal is closely satisfied by this tool.

ND TEST
CMOS TRANSISTOR NETWORK TO GATE LEVEL MODEL EXTRACTOR FOR SIMULATION, VERIFICATION AND TEST GENERATION

CROSS REFERENCE TO RELATED APPLICATION

This is a continuation of U.S. application Ser. No. 08/332,180, filed Oct. 31, 1994, abandoned.

FIELD OF THE INVENTION

The invention relates to computer aided design tools, and more particularly to a network-to-gate level model extractor for simulation, verification and test generation.

BACKGROUND OF THE INVENTION

Without CAD tools, large chips can not be designed in time or within budget. Underlying circuit technologies, however, are constantly changing. If CAD tools are technology dependent, then they need constant modification with every change in technology. This is an expensive proposition.

Usually, the technology dependent components of a CAD system are kept separate so that the tools do not require constant tinkering. Each CAD tool usually recognizes a common, small set of primitives. All technology specific elements are then described by using these primitives for the use by these tools.

The process of expressing behavior of a technology specific entity by primitives recognized by a target CAD tool is called "library" or "rules" or "model" creation. Creation of libraries usually is a two way street, consisting of mapping a technology specific entity to a set of primitives and then verifying that the library/model/rule thus created is a correct representation. The verification of all the rules, however, is extremely time consuming.

In known ASIC designs, designers are free only to make choices among only a given, narrow set of library elements. This may inhibit a designer from reaching his/her design goals. A more open set of technology specific entities, however, calls for larger libraries or the creation of a library on demand which the designer may not be trained to do. An ideal solution, therefore, would be to create further software tools that can generate these libraries automatically, providing flexibility and uniformity.

The present invention is one such tool. The method of the invention can accept a transistor level netlist and produce a gate level description for automatic test pattern generation purposes. The software environment of the invention is flexible enough to tailor to various user needs.

SUMMARY OF THE INVENTION

It is an object of the present invention that for a given input/output sequence, the valid machine behavior of the gate level model is the same as the valid machine behavior of the transistor level network.

It is a further object of the invention that, working on the gate level model thus produced, the test vectors derived by an automatic test pattern generator (ATPG) should detect failures on nets of the transistor level model. This object stipulates that the transistor level to gate level extractor does more than extracting an equation. Furthermore, there are various fault models such as stuck-at, stuck-open, stuck-on, etc., representing varying degrees of complexity in fault modeling. It is an object of the invention to allow options to reflect such complexity.

There are many uses for such a tool, such as:

1. Verification: supposing a designer has created a design for an adder using transistors alone. How does the designer know that this indeed is an adder? The gate level model created by the proposed tool will allow designer to carry out a formal verification using a high level or alternate description of the behavior for this macro (cell/library).
2. Simulation: the libraries thus created will allow for simpler design simulation.
3. Test pattern generation: the requirements from the tool ensure that we have the best possible model for ATPG.

FIGURE

The FIGURE shows the relationship of various functions in the extractor method of the present invention.

DETAILED DESCRIPTION

Philosophy

Conventional, single stuck-at fault model guides the ATPG process such that test vectors place logic values 0 and 1 on every net, while, at the same time, make them logically observable at an output(s). We extend the same principle and wish to make sure that test vectors derived on the translated gate level model actually place values 0 and 1 on the switch level network while making it logically sensitized to an observable output.

Mechanism

Independent variables are introduced for all nets that control gate input of other transistors. The logic equation for all such nodes are found by tracing paths to power supply nodes and external inputs. A path (channel connected path) is electrically active whenever the transistors on this path conduct simultaneously. Based on this AND condition a an AND gate is formed, and all paths leading to the same terminal node (power supply or external input) are OR-ed together as a bunch. Each of these bunches is then combined by additional logic based on user input on desired fault model complexity. If a node is connected by conduction paths to both 0 and 1 nodes (power supply or input), the output could be defined on the basis of dominance (in current implementation it is defined as X, or logically unknown). Similarly, if a net is floating, that is, if it does not have a path to either 0 or 1, it could be construed as floating (in current implementation it is used as X, but could be changed based on environment). Precharge signals are expected to be identified explicitly. A node has a value 1(0), if it was precharged to 1(0) and during normal operation a path to node 0 (1) is not activated. Precharge information can be taken into consideration while defining logic status of a net.

The number of traced paths can be exponentially high and the model could blow up. This may be controlled by eliminating non-functional paths that never conduct under normal conditions. Determination of non-functional paths require a boolean satisfiability solver, and the preferred embodiment of the invention uses a branch and bound justification algorithm to do that, although it can be done by other techniques as well. Examples include approaches based on binary decision diagrams. Elimination of non-functional paths is provided as a user settable option. Boolean satisfiability is not guaranteed to be solvable, so it is parameterized as well to indicate when this process should be suspended.

User Issues

Users may employ transistors that do not perform any static logic function, but improve timing, noise immunity, etc. If they are properly flagged they can be recognized as such. Other means of recognition are: introducing separate entities in hierarchy, cluster recognition, etc. Sequential elements such as memory, RAM, ROM or analog elements may be embedded in a design on which extractions are performed. In such cases if the boundaries of these entities are clearly specified (through hierarchy or additional user input) they may be properly represented in the final output. External conditions on the input combinations can be provided to work with the boolean satisfiability solver as well. The program can also automatically detect parallel transistors and logically identical switching paths and eliminate duplications from the final model.

A preferred implementation of the present invention is presented in the source code listing in the Appendix hereto.

We claim:

1. A transistor network to gate level model extraction method, comprising:

reading in a transistor netlist and user inputs;

providing user inputs identifying a particular section of the transistor network to be analyzed;

inputting a set of relationships that are not accepted by the transistor network;

listing, for every net that drives an input to a transistor, the channel-connected paths that act as inputs to the transistor;

determining the conduction status of each path under precharge conditions and evaluating the condition;

forming AND gates representing the logical condition under which each path will conduct;

using OR gates, OR'ing all AND gate outputs in various groups that represent paths ending at various terminal nodes, e.g., GND, $V_{DD}$, primary input;

based upon the user input, and the output of the OR gates, producing an output such that: if only paths to logic node 0 are turned on, the output will be 0; if only paths to logic node 1 are turned on, the output will be 1; and if the paths to logic nodes 0 and 1 are turned on, the output is based on additional information, including user information, and further analysis of transistor sizes; and if no paths are turned on, producing an appropriate output such as a floating output or X.

2. The method of claim 1, further comprising:

while building each path, performing on each partial path:

running a boolean satisfiability solver on the inputs of the partial path, the satisfiability solver being parameterized so that the satisfiability program is able to abort if no solution is found within a given limit; if the decision to abort is made, assuming the path is valid;

if the boolean satisifiability program returns an unsatisfactory negative result, the path is pruned.

* * * * *